US009708181B2

(12) United States Patent
Kennedy et al.

(10) Patent No.: US 9,708,181 B2
(45) Date of Patent: Jul. 18, 2017

(54) HERMETICALLY SEALED PACKAGE HAVING STRESS REDUCING LAYER

(71) Applicant: Raytheon Company, Waltham, MA (US)

(72) Inventors: Adam M. Kennedy, Santa Barbara, CA (US); Buu Q. Diep, Murphy, TX (US); Stephen H. Black, Buellton, CA (US); Tse E. Wong, Los Alamitos, CA (US); Thomas Allan Kocian, Dallas, TX (US); Gregory D. Tracy, Buellton, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 15/048,106

(22) Filed: Feb. 19, 2016

(65) Prior Publication Data
US 2016/0167959 A1    Jun. 16, 2016

Related U.S. Application Data

(62) Division of application No. 14/456,476, filed on Aug. 11, 2014, now Pat. No. 9,334,154.

(51) Int. Cl.
*H01L 21/50* (2006.01)
*B81C 1/00* (2006.01)
*B81B 7/00* (2006.01)

(52) U.S. Cl.
CPC ........ *B81C 1/00333* (2013.01); *B81B 7/0048* (2013.01); *B81B 7/0051* (2013.01);
(Continued)

(58) Field of Classification Search
CPC . B81B 7/0051; B81B 7/0048; B81C 1/00333; B81C 1/00825
(Continued)

(56) References Cited

U.S. PATENT DOCUMENTS 5,701,008 A    12/1997  Ray et al.
6,046,074 A     4/2000  McHerron et al.
(Continued)

FOREIGN PATENT DOCUMENTS

EP    0 434 392 A1    6/1991
JP    H 06-140527 A   5/1994

OTHER PUBLICATIONS

Notice of Allowance dated Jan. 21, 2016; For U.S. Appl. No. 14/456,476; 7 pages.
(Continued)

*Primary Examiner* — Luan C Thai
(74) *Attorney, Agent, or Firm* — Daly, Crowley, Mofford & Durkee, LLP

(57) ABSTRACT

A sealed package having a device disposed on a wafer structure and a lid structure boned to the device wafer. The device wafer includes: a substrate; a metal ring disposed on a surface portion of substrate around the device and a bonding material disposed on the metal ring. The metal ring extends laterally beyond at least one of an inner and outer edge of the bonding material. A first layer of the metal ring includes a stress relief buffer layer having a higher ductility than that of the surface portion of the substrate and a width greater than the width of the bonding material. The metal ring extends laterally beyond at least one of the inner and outer edges of the bonding material. The stress relief buffer layer has a coefficient of thermal expansion greater than the coefficient of expansion of the surface portion of the substrate and less than the coefficient of expansion of the bonding material.

4 Claims, 7 Drawing Sheets

(52) U.S. Cl.
CPC .. *B81C 1/00825* (2013.01); *B81B 2201/0207* (2013.01); *B81C 2203/035* (2013.01)

(58) Field of Classification Search
USPC .......................................................... 438/126
See application file for complete search history.

(56) References Cited

U.S. PATENT DOCUMENTS

| | | |
|---|---|---|
| 6,342,407 B1 | 1/2002 | Goldmann et al. |
| 6,472,762 B1 | 10/2002 | Kutlu |
| 6,521,477 B1 | 2/2003 | Gooch et al. |
| 6,744,132 B2 | 6/2004 | Alcoe et al. |
| 6,965,168 B2 | 11/2005 | Langhorn |
| 7,065,867 B2 | 6/2006 | Kim et al. |
| 7,872,338 B2 | 1/2011 | Tarn |
| 8,759,155 B2 | 6/2014 | Lin et al. |
| 8,766,734 B2 | 7/2014 | Chang et al. |
| 8,836,449 B2 * | 9/2014 | Pang .................... H03H 9/0547 333/187 |
| 2005/0227413 A1 | 10/2005 | John et al. |
| 2010/0225231 A1 | 9/2010 | Cok |
| 2012/0096813 A1 | 4/2012 | Gooch et al. |
| 2014/0193948 A1 | 7/2014 | Gooch et al. |
| 2016/0039665 A1 | 2/2016 | Kennedy et al. |

OTHER PUBLICATIONS

PCT International Search Report and Written Opinion of the ISA dated Apr. 8, 2015; For PCT Pat. App. No. PCT/US2014/050589; 17 pages.
PCT Notification Concerning Transmittal of the International Preliminary Report on Patentability (Chapter 1 of the Patent Cooperation Treaty), PCT/US2014/050589, dated Feb. 23, 2017, 1 page.
PCT International Preliminary Report on Patentability, PCT/US2014/050589, dated Feb. 23, 2017, 1 page.
PCT Written Opinion of the International Searching Authority, PCT/US2014/050589, dated Feb. 23, 2017, 9 pages.

* cited by examiner

HERMETICALLY SEALED PACKAGE HAVING STRESS REDUCING LAYER

RELATED APPLICATIONS

This application is a Divisional Application of U.S. patent application Ser. No. 14/456,476 entitled HERMETICALLY SEALED PACKAGE HAVING STRESS REDUCING LAYER, filed on Aug. 11, 2014, which is incorporated herein by reference in its entirety.

TECHNICAL FIELD

This disclosure relates generally to electronic packaging and more particularly to Microelectromechanical system (MEMS) packaging.

BACKGROUND AND SUMMARY

As is known in the art, Microelectromechanical systems (MEMS) are integrated micro devices or systems combining electrical and mechanical components. MEMS devices may be fabricated using, for example, standard integrated circuit batch processing techniques. Exemplary applications for MEMS devices include sensing, controlling, and actuating on the micro scale. Such MEMS devices may function individually or in arrays to generate effects on a macro scale.

As is also known in the art, many MEMS devices require a hermetically sealed environment in order to attain maximum performance. This could be a vacuum environment, a controlled pressure environment or a controlled gas environment. The package environment also provides protection and an optimal operating environment for the MEMS device. Specific examples of these MEMS devices include infrared MEMS such as bolometers, sometimes referred to as microbolometers, certain inertial MEMS such as gyros and accelerometers, and optical mechanical devices such as moving mirror arrays. Previously, MEMS devices have been individually packaged in vacuum compatible packages alter fabrication and dicing of the MEMS device wafer. Often, however, the cost of packaging MEMS devices in traditional metal or ceramic packages may be on the order of about 10 to 100 times the device fabrication cost. This is especially true if a vacuum is required in the package.

Over the years, various types of infrared detectors have been developed. Many include a substrate having thereon a focal plane array, the focal plane array including a plurality of detector elements (detector devices) that each correspond to a respective pixel. The substrate contains an integrated circuit which is electrically coupled to the detector elements, and which is commonly known as a read out integrated circuit (ROIC) and which is used to integrate the signal from each detector element and multiplex the signals off the chip with appropriate signal conditioning and processing.

As is the case with certain microelectromechanical (MEMS) devices, bolometers may need to be hermetically packaged in vacuum or other controlled environment conditions for best performance. Exemplary requirements for the packaging of bolometer arrays include reliable hermetic sealing capable of maintaining a high vacuum for an extended period of time, the integration of IR window material with good infrared transmission, and high yield/low cost packaging. Both the reliability and the cost of MEMS devices depend upon encapsulation (packaging) techniques chosen. For MEMS based bolometers, packaging may be done at the chip level or at the wafer level. A common way of packaging in this instance is to fabricate a protective, IR-transmitting cap wafer, or Window Cap Wafer (WCW), and bond it to an exposed surface of the semiconductor substrate, or device wafer, containing the active IR detector bolometer areas prior to dicing. The cap wafer, sometimes, also referred to as a window or lid structure, is formed with cavities therein such that when the cap wafer is flipped and bonded to the device wafer, the cavities provide sufficient clearance to accommodate and protect the MEMS devices therein as described in U.S. Pat. No. 5,701,008, entitled Integrated infrared microlens and gas molecule getter grating in a vacuum package, inventors Ray et al., issued Dec. 23, 1997. As described therein, and referring to FIGS. 1 and 2, a package assembly is shown having a readout integrated circuit (ROIC) substrate 2 of a semiconductor material, preferably silicon. An IR detector array 14 is positioned on the substrate 2 and includes a plurality of individual detector elements, also called pixels, 6. Although FIG. 2 shows only a 5×6 rectangular array of detector pixels 6 in detector region 10, it is understood that a typical IR integrated circuit generally includes a planar IR detector array with up to several hundred or even thousand by several hundred or even thousand pixels 6. In most commercial applications, IR detectors are usually uncooled and detect the intensity of IR radiation by sensing increases in temperature which result from the heat imparted to the detectors by the IR radiation. A typical example of an uncooled IR detector is a vanadium oxide (VOx) microbolometer (MB), in which a plurality of individual detectors are usually formed in an array on the ROIC substrate 2 by conventional semiconductor manufacturing processes. The MB array detects IR radiation by sensing the IR-generated heat, and is also called a focal plane array (FPA) or a sensor chip assembly (SCA). The substrate 2 is an integrated circuit used to process the signal produced by the bolometers. In this case the bolometer is a microbridge resistor that changes its resistance when its temperature changes. The incoming radiation causes a change in the temperature of the microbridge. Although other semiconductor materials such as Si may be used, VOx is a commonly available and cost effective material that is used in most commercial IR detection applications.

As described in the above-referenced U.S. Pat. No. 5,701,008, the vacuum-sealed assembly includes a hermetic seal 8 surrounding the IR detector array to seal off the detector array from the atmosphere. The seal 8 can be, for example, an indium, gold-tin, or other solder, with the height of the seal precisely controlled when it is deposited on the substrate 2 or preferably wafer 10. The seal 8 supports a second substrate, a cap wafer, here an IR transparent window 10, here for example, silicon so that with wafer level packaging the window wafer 10 must have a compatible thermal expansion coefficient with the FPA wafer which is also silicon. The wafer 10 may include a gettering material, not shown formed, on a predetermined region of the surface of the wafer 10 having a predetermined surface area as described in the above-referenced U.S. Pat. No. 5,701,008.

As is also known in the art, Wafer Level Packaging (WLP) was developed to address the high cost of packaging of MEMS by eliminating the traditional packages. One such WLP package is described in U.S. Pat. No. 6,521,477, entitled Vacuum package fabrication of integrated circuit components, inventors Gooch et al., issued Feb. 18, 2003. In one WLP process, two wafers may be bonded together using a joining material to yield bonded wafers. For example, one of the wafers is a semiconductor (for example, silicon) device wafer having therein the detector devices in a detector region of the wafer, the detector region being disposed in a central interior region of the device wafer along with a read out integrated circuit (ROIC) which is bonded to the other wafer, the lid wafer using an seal metal ring of solder disposed about the detector region of the device wafer. After forming the devices in the semiconductor wafer, the wafer includes a thin overglass layer, such as silicon nitride or silicon oxynitride (SiON). The seal ring metal is fainted using conventional photolithographic processing to form a bottom layer of titanium, which serves as a substrate adhesion layer to the ROIC overglass, then an intermediate layer of Nickel, which serves as a diffusion barrier followed by a layer of gold to prevent oxide formation and enhance solder bonding, which will subsequently be referred to as the "seal ring". A similar set of layers is formed on the lid wafer which provides a mating surface for the solder seal between the device and lid wafer. Following the formation of the seal ring, solder, for example Au 80% and Sn 20%, is applied to either or both the device and lid wafer.

While the WLP technique described provides an effective package, the inventors have recognized that because the difference between the thermal coefficient of expansion of the AuSn solder and the semiconductor device wafer, stresses may build up at high stress region as shown in FIG. 3 wherein the edge of the seal ring contacts the device or ROIC wafer. These stresses may cause unwanted cracks to develop in the overglass and underlying structure of the device or ROIC wafer as shown in FIG. 3. These cracks can break the interlayered dielectric layer (ILD) and metal interconnecting traces in the ILD of the ROIC leading to failure.

More particularly, the inventors have recognized that in the prior art the seal ring metal stack (about 0.5 um thick) and the solder (up to 11 um thick) have a coincident edge. As the solder cools below its ~280 degree Centigrade melting temperature the solder shrinks faster than the underlying seal ring and ROIC (solder CTE ~16 ppm, silicon CTE ~3 ppm), and the solder is very stiff (AuSn solder has a high Young's modulus) so it cannot deform to relieve the stress. The shrinkage of the solder layer tends to pull on the edge of the solder joint, which is the source of a stress point r and the resulting crack at the edge of the joint. Simply increasing the thickness of the titanium (Ti) portion of the underlying portion of the seal ring has little effect on stress because one is still left with the solder pulling on the edge of the seal ring, which results in the stress point. By terminating the solder short of the edge of the metal that adheres to the ROIC surface and providing an intervening layer, the stress relief buffer layer, of, for example, titanium, the abrupt edge that conducts the stress down to a localized region on the ROIC surface is terminated above the ROIC's surface and covered with a more ductile material. The inventors have further recognized that once the coincident edge is eliminated, thickening the underlying titanium layer either by thickening the stress relief buffer layer, in one embodiment, or thickening the titanium bonding material adhesion layer, in another embodiment, will further reduce stress, but only if the coincident edge is first eliminated.

In accordance with the disclosure, a structure is provided having: a substrate; a metal ring disposed on a surface portion of the substrate around a surface region of the substrate; a bonding material disposed on the metal ring, the bonding material having inner and outer edges; and wherein the metal ring extends laterally beyond at least one of the inner and outer edges of the bonding material.

In one embodiment, a first layer of the metal ring includes a stress relief buffer layer disposed on the surface portion of the substrate, the first layer having a higher ductility than that of the surface portion at a predetermined temperature, \and a width greater than the width of the bonding material, the stress relief buffer layer extending laterally beyond at least one of the inner and outer edges of the bonding material.

In one embodiment, the stress relief buffer layer has a coefficient of thermal expansion greater than the coefficient of expansion of the surface portion of the substrate and less than the coefficient of expansion of the bonding material.

In one embodiment, outer regions of a top surface of the metal ring comprise material inhibiting adhesion of the bonding material to the top surface, and wherein portions of the metal ring extend laterally beyond at least one of the inner and outer edges of the bonding material In one embodiment, a bonding material masking layer on the top surface of the metal ring, the bonding material passing through a window in the masking layer exposing a portion of the top surface of the metal layer and wherein a portion of the bonding material passes through the window onto the exposed portion of the top surface of the metal layer.

In one embodiment, portions of the metal ring extend laterally beyond at least one of the inner and outer edges of the bonding material.

In one embodiment, a lid and wherein the bonding material bonds the substrate to the lid.

The stress relief buffer layer adheres effectively to the substrate and is not wetted by the bonding material. Furthermore, the stress relief buffer layer has a Coefficient of Thermal Expansion (CTE) preferably midway between the CTE of the surface portion of the substrate bonded to the stress relief buffer layer and the CTE of the solder or bonding material and has the property of a ductile material to locally yield in regions of high stress instead of fracturing as in the case of brittle materials such as SiON and Silicon. An exemplary stress relief buffer layer material is titanium.

With such an arrangement, stress produced between the substrate, for example, a semiconductor wafer and the adhesive layer is shifted from a point where the edge of the bonding material contacts the semiconductor wafer to a point where the edge of the bonding material contact the stress relief buffer layer and thus is shifted away from the semiconductor wafer and any associated overglass or brittle substrate material. Thus, the stress relief buffer layer serves as a stress reducing layer, shifting the region of high stress from the brittle overglass to the more ductile underlying layer.

More particularly, when using a solder having a high thermal contraction rate to bond and hermetically seal the two wafers to form the package, as the solder cools from its melted temperature it shrinks, inducing high levels of stress in the underlying semiconductor wafer at the edges of the solder joint. The use of the stress relief buffer layer 1 isolates the high stress region at the edge of the solder joint from the underlying brittle semiconductor wafer, interposing the material of the stress relief buffer layer having a higher level of ductility than the ductility of the semiconductor wafer, and a thermal contraction rate less than the solder yet higher than the underlying wafer. The stress relief buffer layer has a thermal expansion between that of the solder layer and the surface of the wafer and reduces the stress in the more brittle wafer. Thus, the disclosure enables the integration of a high CTE solder or other bonding material with a brittle overglass layer on a semiconductor structure. Further, the process may be used on the device wafer, lid or both.

It should be understood that the term ring-shaped refers to and includes shape enclosing a space; it may be circular, rectangular, square oval or may have an irregular shape, such as a serpentine or meandering shape.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 4:
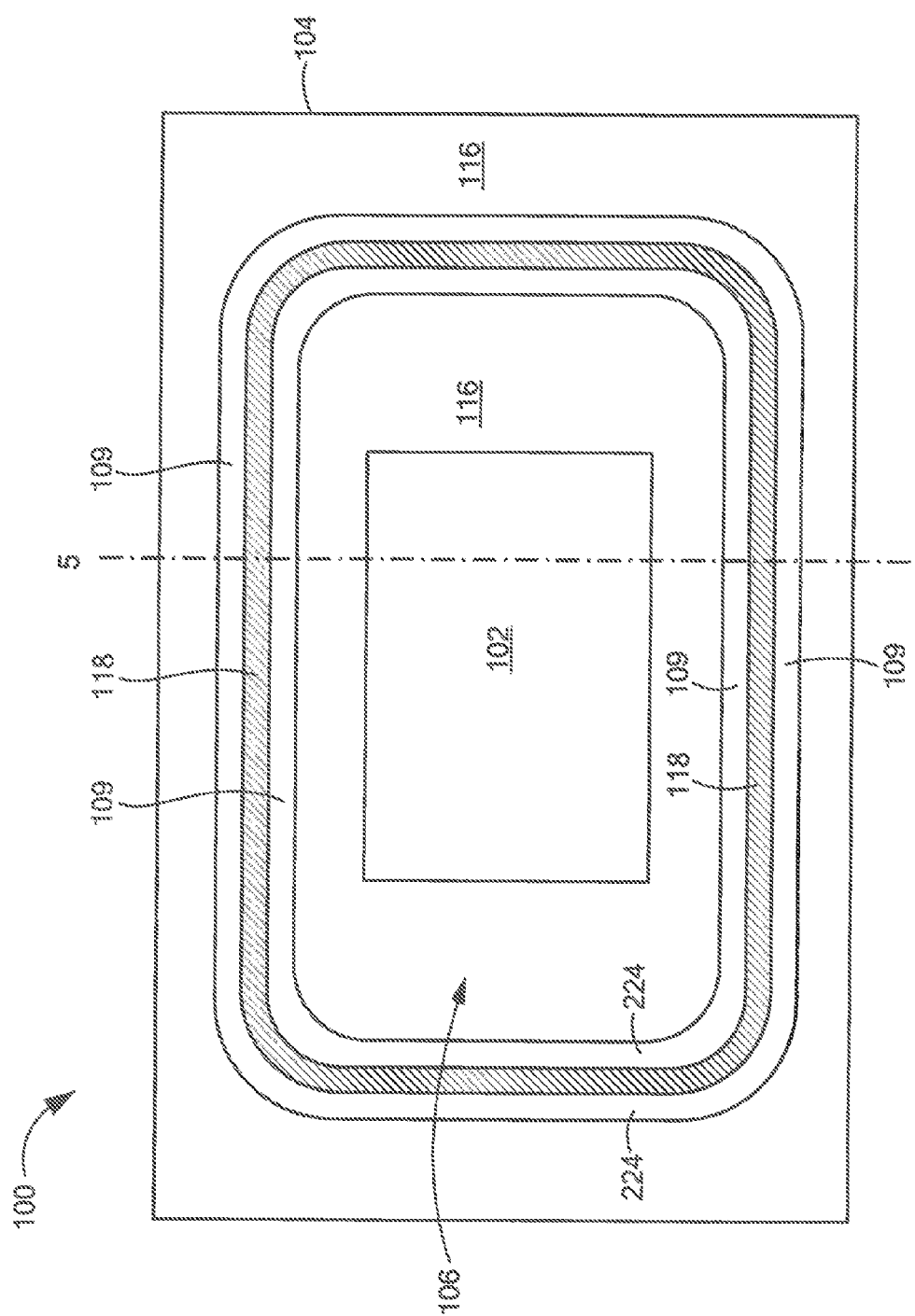
FIG. 4 is a cross sectional, plan view, of a hermetically sealed package according to the disclosure, the cross section being taken along line 4-4 in FIG. 5.
Figure 5:
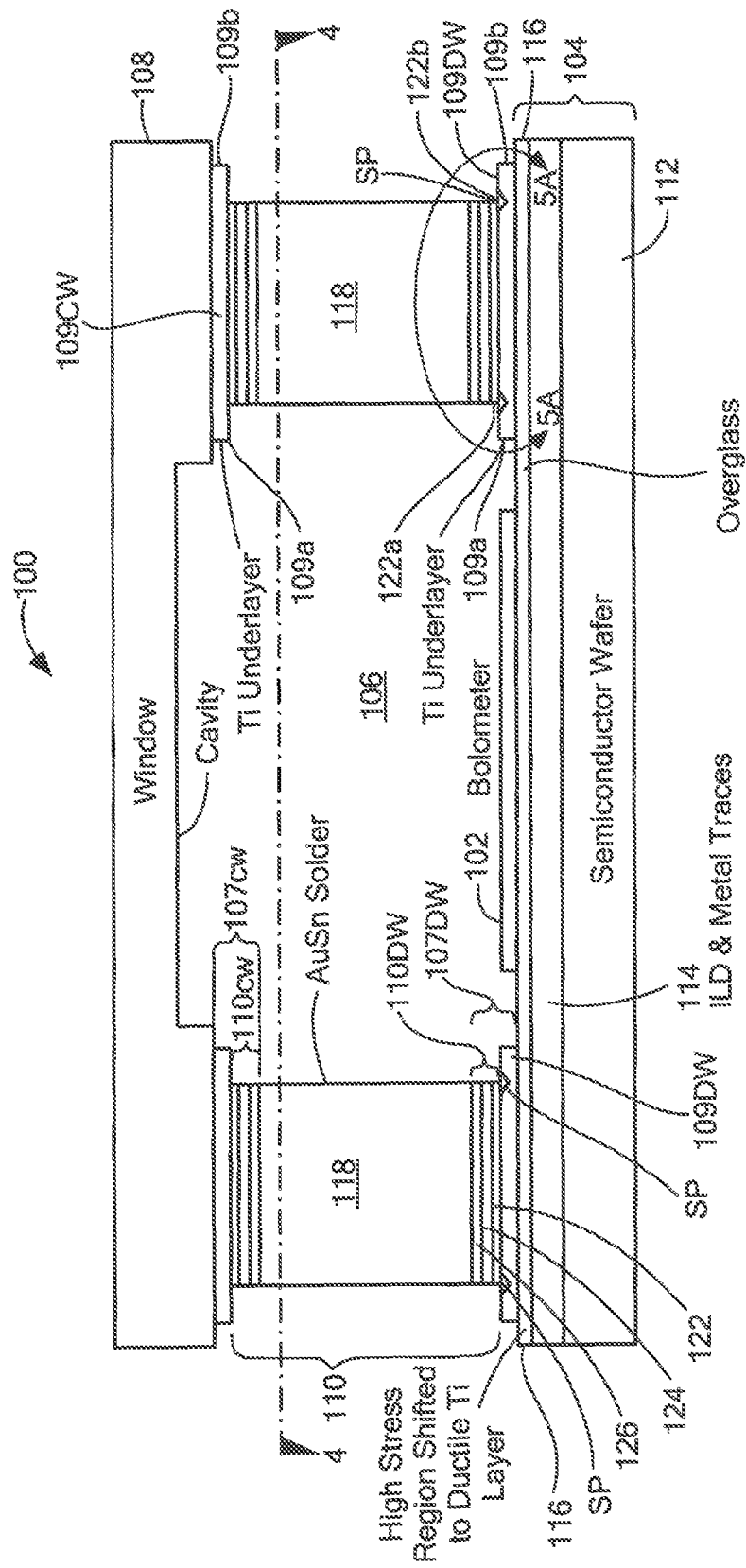
FIG. 5 is a cross section elevation view of the package of FIG. 4, such cross section being taken along line 5-5 in FIG. 4.

Referring now to FIGS. 4 and 5, a hermetically sealed package 100 is shown for hermetically sealing a device 102. The package 100 includes: substrate 104 having, in a central region 106 thereof, the device 102; a cap wafer 108 (FIG. 5); and a pair of metal rings, here for example, multi-layer metal rings, 107DW metal ring, 107CW; metal ring 107DW being disposed on a surface of the substrate 104 around a surface region 106 of the substrate 104, and the other metal ring 107CW being disposed on the surface of the cap wafer 108 around the central region 106. It should be understood that in some applications the metal ring 107CW may not be needed. The metal ring 107DW includes: a ring-shaped stress relief buffer layer 109DW disposed on, and in direct contact with, the surface of the substrate 104 (more particularly on and in direct contact with an overglass layer 116 of the substrate 104), as shown more clearly in FIG. 5A; and a seal ring structure 110DW (FIG. 5), on the upper surface of the ring-shaped stress relief buffer layer 109DW. The metal ring 107CW includes: a ring-shaped stress relief buffer layer 109CW on the surface of the cap wafer 108 around the central region 106; and a seal ring structure 110CW, on the upper surface of the a ring-shaped stress relief buffer layer 109CW. A bonding material 118 is disposed between the two seal ring structures 110DW, 110CW, as shown in FIG. 5. Thus, as will be described in more detail below, the ring-shaped stress relief buffer layer 109CW is an underlying material of the ring seal structure 110CW and the ring-shaped stress relief buffer layer 109DW is an underlying material of the ring seal structure 110DW. Each of the stress relief buffer layers 109CW and 109DW serves as a ring-shaped bonding material stress relief buffer layer for the cap wafer 108 and the device wafer (or substrate 104), respectively.

More particularly, the substrate 104 includes: a semiconductor device wafer 112, here for example, silicon, providing a Read Only Integrated Circuit ROIC; interlayer dielectric layers (ILD) 114 on the upper surface of the device wafer 112 having metal interconnecting electrically conductive traces for the ROIC components; and an overglass layer 116 disposed over the layers 114, as shown. The device 102 is here, for example, an array of Infrared (IR) detectors, here for example, a bolometer, is disposed in the central region 106 on the overglass 116, as shown. The cap wafer 108 is any IR transparent material and has a cavity disposed over the device 102, as shown, and may include a getter material, not shown.

Each of the pair of ring-shaped stress relief buffer layers 109DW, CW is, for reasons to be described, a highly ductile material, here, for example, titanium. The ring-shaped stress relief buffer layer 109DW is disposed on the overglass layer 116, as described above. Each one of the two seal ring structures 110DW and 110CW includes, as shown more clearly in FIG. 5A for seal ring structure 110DW, a lower, substrate adhesion layer 122, here, for example, titanium, disposed on the stress relief buffer layer 109 on the overglass 116 and the cap wafer 108, respectively; a diffusion barrier layer 124, here for example, Ni or Pt, disposed on the substrate adhesion layer 122, as shown, to prevent the bonding material 118 from diffusing into (or interacting) with the substrate adhesion layer 122; and an oxidation blocking/bonding material adhesion layer 126, here for example, gold (AU), disposed on the diffusion barrier layer 124, as shown, for preventing oxide formation and to promote solder wetting.

It is noted that each one of the pair of ring-shaped stress relief buffer layers 109CW, 109DW is wider than the seal ring structures 110CW, 110DW, respectively, and the bonding material 118. It is noted that, in this embodiment, the inner and outer edges 109a, 109b, respectively, of the ring-shaped stress relief buffer layers 109CW, 109DW, extend beyond at least one of the inner and outer, here beyond both the inner and outer edges 110a, 110b, respectively, of the seal ring structures 110CW, 110DW, respectively, a length L to form steps 224 on either side of the seal rings structures 110CW, 110DW, respectively, as shown more clearly in FIG. 5A for stress relief buffer layer 109DW and seal ring structure 110DW.

Figure 1:
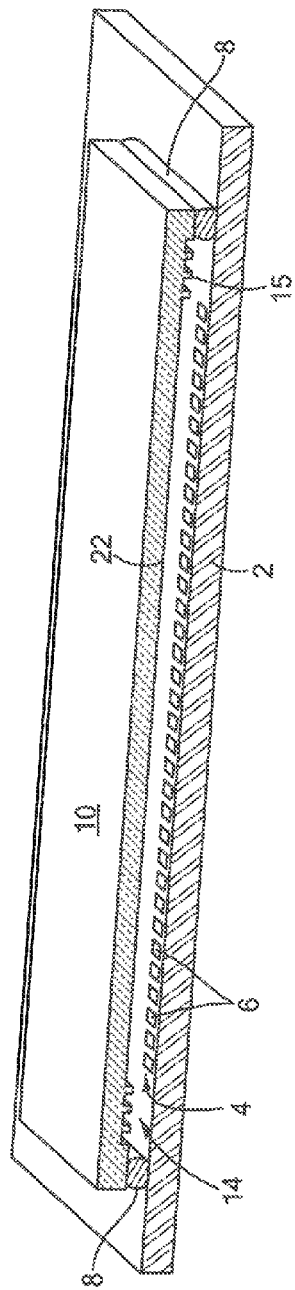
FIG. 1 is a simplified cutaway perspective view of a vacuum package for an IR detector array in accordance with the PRIOR ART.
Figure 2:
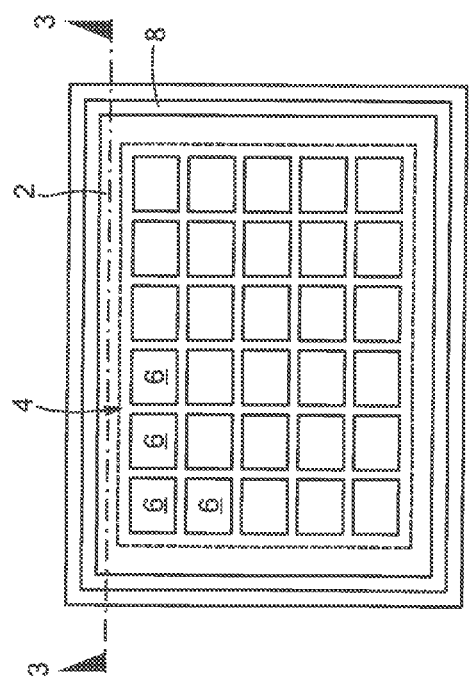
FIG. 2 is a simplified plan view of the IR detector array used in the assembly of FIG. 1 according to the PRIOR ART.
Figure 3:
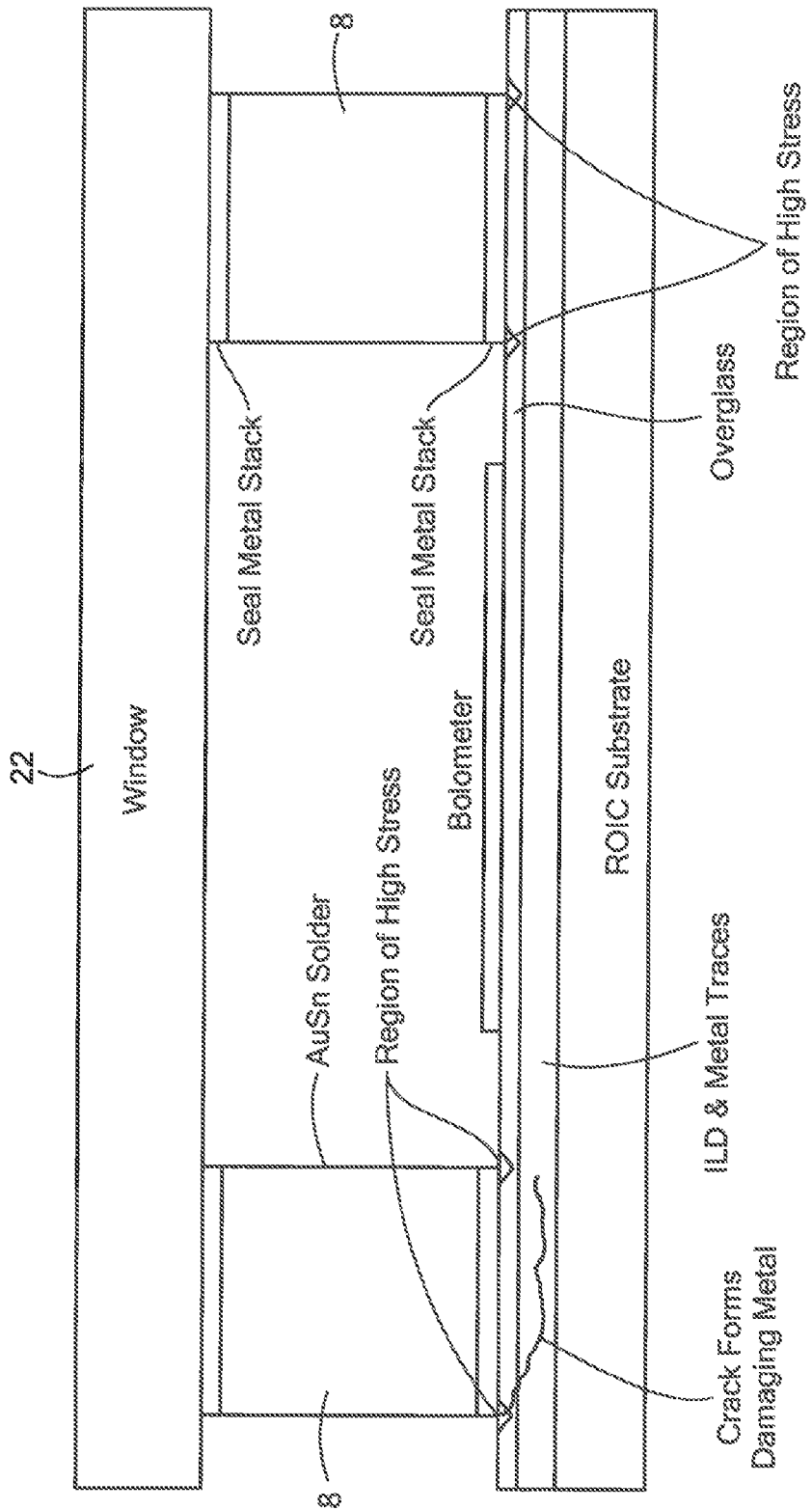
FIG. 3 is a cross sectional view of the IR detector array of FIG. 2, such cross section being taken along line 3-3 in FIG. 2 according to the PRIOR ART.
Figure 5A:
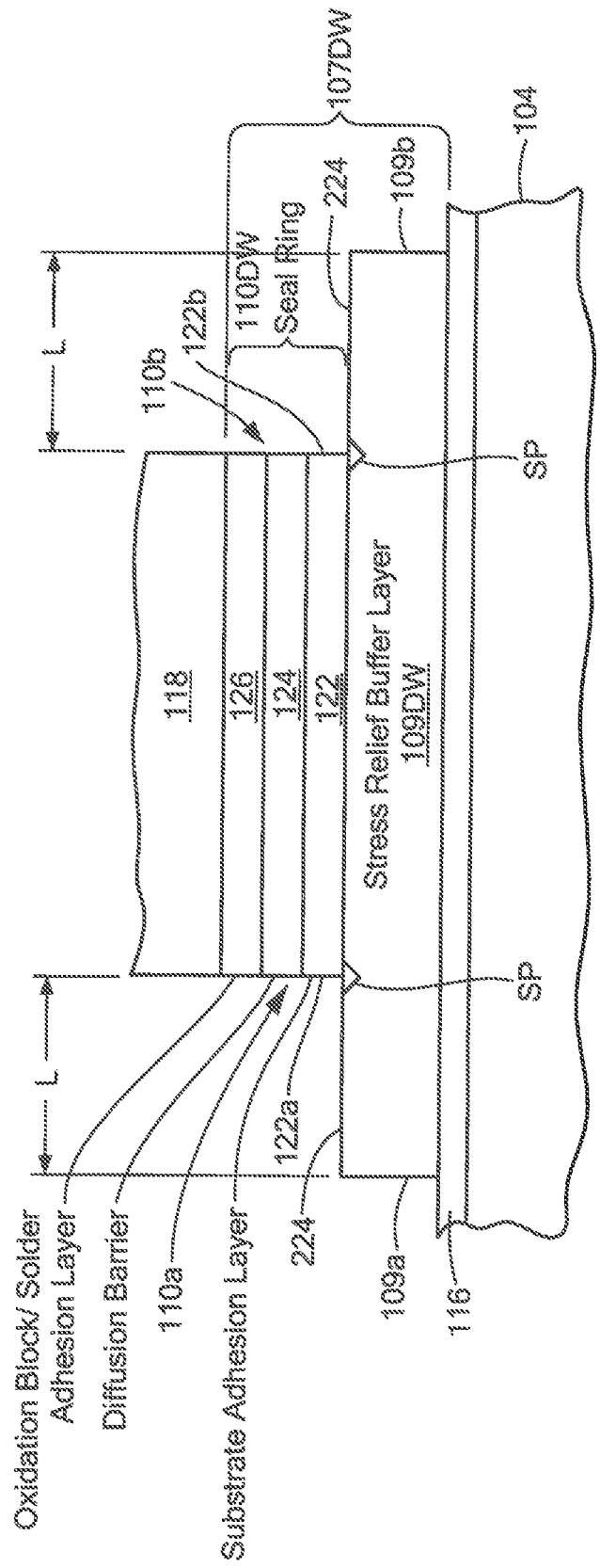
FIG. 5A is an enlarged portion of the cross section elevation view of FIG. 5, the enlarged portion being enclosed by arrow 5A-5A in FIG. 5.

More particularly, in this embodiment, the overglass layer 116 is, here for example, a 2000 Angstrom thick silicon oxynitride (SiON) layer, each one of the pair of ring-shaped stress relief buffer layers 109CW, 109DW is here, for example, a layer of titanium having a thickness greater than 500 Angstroms, here, for example, a thickness of 2500 Angstrom. Here, for example, each one of the ring-shaped stress relief buffer layers 109CW, 109DW is formed using a photolithographic lift-off process. Considering the formation of the stress relief layer 109DW, and recognizing that the stress relief layer 109CW is formed in like manner, the ring-shaped stress relief buffer layers 109DW is here, for example, formed by first forming a layer of photoresist, not shown, over the overglass layer 116. The regions of the photoresist layer inside and outside of the region of the device where the ring-shaped stress relief buffer layer 109DW remains, and thereby leaving the ring-shaped region of the wafer surface where the ring-shaped stress relief buffer layer 109DW is to be formed exposed. Next, the entire surface of the wafer is coated with the titanium using either an evaporation or physical vapor deposition (PVD) process; it being noted that one portion of the titanium will become deposited on the patterned photoresist and other portions will be deposited on the exposed ring-shaped portions of the wafer. Subsequently, the photoresist is lifted off the wafer thereby removing the portions of the titanium on the photoresist and leaving on the wafer the ring-shaped stress relief buffer layer 109DW. The material can also be fabricated using a mechanical mask without the need for a photolithography process. Next, another lift off process is used to form the seal ring structure 110DW, here titanium having a thickness of, for example, 2000 Angstroms deposited using either an evaporation or physical vapor deposition (PVD) process, followed by nickel having a thickness of 2500 Angstroms is deposited using either an evaporation or physical vapor deposition (PVD) process and gold having a thickness of 2500 Angstroms is deposited using either an evaporation or physical vapor deposition (PVD) process. It is noted that the width of the ring-shaped stress relief buffer layer 109DW is here in the range of 300 micrometers, the width of the ring-shaped seal ring structure 110DW is here, for example narrower (200 micrometers) than the width of the ring-shaped stress relief buffer layer 109DW and is set back from the inner and outer edges 109a, 109b, respectively, of the ring-shaped stress relief buffer layer 109DW (FIG. 5A). Here, for example, the inner and outer edges 110a, 110b, respectively of the seal ring structure 110DW is each set back the length L, here, for example, 50 micrometers from the inner and outer edges 109a, 109b, respectively, the ring-shaped stress relief buffer layer 109DW, to form the steps 224 as indicated in FIG. 5A. Here, for example, a 50 micrometer wide step 224 is formed. As a result, the abrupt edge of the bonding material 118, for example solder, (here for example, gold/tin (here, for example, Au 80% SN 20%)) solder is set back from the edge of the ring-shaped stress relief buffer layer 109DW and lifted above the surface of the substrate 104 and cap wafer 108, respectively. As a result, the high stress point described in FIG. 3 is shifted (elevated away from the overglass layer 116); and, the stress relief buffer layer 109DW is effectively inserted in the path of the high stress point thereby reducing stress in the brittle SiON overglass layer 116. It is noted that the stress relief buffer layer 109DW has a higher ductility than the ductility of the SiON overglass layer 116 at a predetermined temperature, such as room temperature (20-23 degrees centigrade) or the temperature of the package 100 when the lid 108 is bonded to the substrate 118, and that the Coefficient of Thermal Expansion (CTE) of the stress relief buffer layer 109DW, which is inserted between the solder 118 and the substrate 118, has a value between the value of the CTE of the solder and the value of the CTE of the overglass layer 116. The stress relief buffer layer 109DW having a higher ductility relative to the SiON overglass layer 116 allows for small levels of local deformation, further reducing stress in the brittle SiON overglass layer 116.

As a result, the high stress point SP is shifted out of the brittle SiON layer 116 (where it was located in the FIG. 3) and into the more ductile stress relief buffer layer 109DW. The stress point associated with the abrupt end of the stress relief buffer layer 109DW is reduced to the point of insignificance due to the stress relief buffer layer 109DW having a CTE closer to that of the underlying substrate 104 combined with the relative thinness (here, for example, 2500 Angstrom) of the stress relief buffer layer 109DW increasing its ductility. Additionally, because the small step 224 FIG. 5A) is surfaced with titanium oxide following air exposure it is somewhat solder phobic and thus serves as a solder dam to resist the spread of molten solder 118 from the joint. That is, the surface of 109CW and 109DW is titanium which oxidizes quickly into titanium oxide and titanium oxide is a material that inhibits adhesion of the bonding material 118 to it.

It is noted that the Coefficient of Thermal Expansion (CTE) of AuSn solder=16 ppm/K; the CTE for Ti≅8.5 ppm/degree Kelvin; the CTE for Silicon≅2.6 ppm/degree Kelvin; and the CTE for SiON≅2 ppm/degree Kelvin. It is noted that the ring-shaped stress relief buffer layer 109DW has a Coefficient of Thermal Expansion (CTE) (≅8.5 ppm/degree Kelvin) between (approximately mid-way between) the CTE of the surface portion of the substrate bonded to the stress relief buffer layer 109DW, (i.e., the overglass layer 116 (2 ppm/degree Kelvin), and the CTE of the bonding material 118 (16 ppm/K) on the seal ring structure 110DW.

Thus, it is noted that the CTE difference between AuSn solder 118 and Si is very large (a factor of 6). These are the two primary materials that are creating the stress problem. As the solder cools from the melted state of the solder, it wants to shrink a factor of >6 more than the silicon to which it is attached. It is noted that the stress relief buffer layer 109DW has a Coefficient of Thermal Expansion (CTE) preferably midway between the CTE of the overglass layer 116 and the CTE of the solder or bonding material 118 and such that the ductile stress relief buffer layer 109DW is able to locally yield in regions of high stress instead of fracturing as in the case of brittle materials such as SiON and Silicon. It is also noted that the stress relief buffer layer 109CW has a higher ductility than the ductility of the silicon cap wafer 108 and that the Coefficient of Thermal Expansion (CTE) of the stress relief buffer layer 109CW, which is inserted between the solder 118 and the silicon cap wafer 108.

Figure 6:
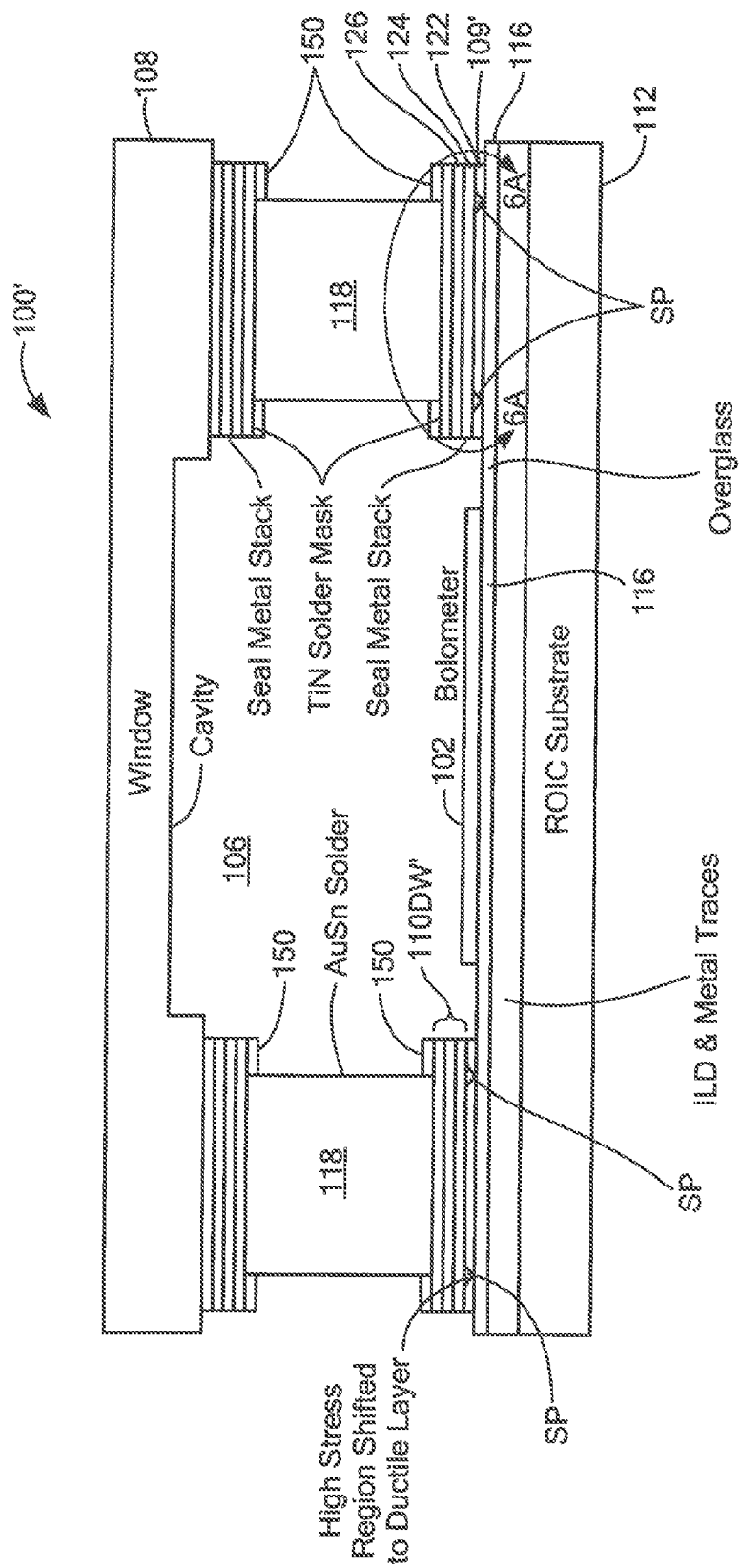
FIG. 6 is a cross section elevation view of a hermetically sealed package according to another embodiment of the disclosure.
Figure 6A:
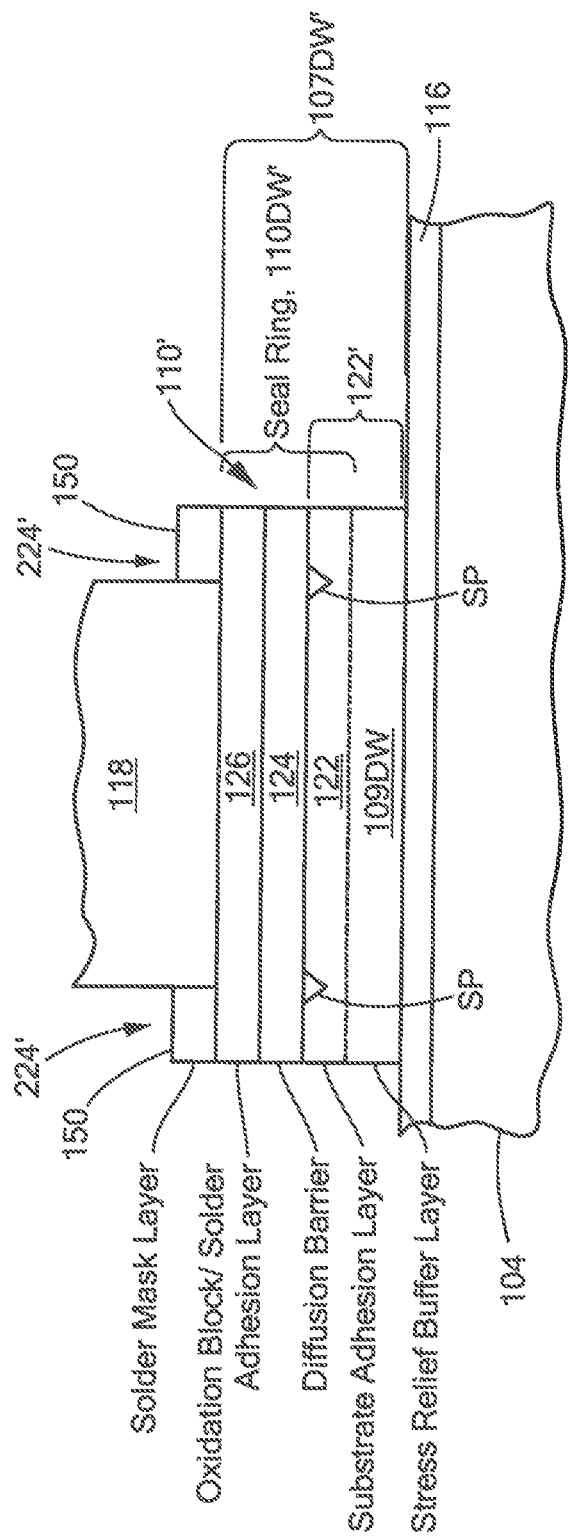
FIG. 6A is an enlarged portion of the cross section elevation view of FIG. 5, the enlarged portion being enclosed by arrow 6A-6A in FIG. 6.

Referring now to FIG. 6 a hermetically sealed package 100' according to another embodiment of the disclosure is shown. Here, the seal ring structure 110DW' has a titanium substrate adhesion/diffusion barrier layer 122' (FIG. 6A) (in effect, layer 122' being made up of diffusion bather layer 122 and the stress relief layer 109DW. Thus substrate adhesion/diffusion barrier layer 122' is titanium thickened to, in effect, an approximately 4000 Angstroms thick layer to serve a dual purpose of a substrate adhesion layer 122 and stress relief layer 109DW. A solder mask 150, here for example titanium or titanium nitride, has a window formed therein using photolithographic-etching processing or liftoff lithography to expose an underlying portion of bonding material adhesion layer 126. It is noted that if titanium is used for the solder mask 150, the titanium oxidizes quickly into titanium oxide and titanium oxide is a material that inhibits adhesion of the bonding material 118 to it. Likewise, titanium nitride is a material that inhibits adhesion of the bonding material 118 to it.

The bonding material 118, here for example, solder, is deposited into the window onto the exposed portion of bonding material adhesion layer 126. It is noted that the seal material 118 is narrower than metal ring 107DW' which hem includes: the seal ring structure 110DW' and the solder mask 150, as shown, to set back the edges of the bonding material 118 from the edges of the metal ring 107DW'. It is also noted that this set back forms a solder dam equivalent to the step 224 described above in connection with FIGS. 5 and 5A. It should be understood that a similar structure is, in this example, used for the metal ring on the cap wafer 108.

A number of embodiments of the disclosure have been described. Nevertheless, it will be understood that various modifications may be made without departing from the spirit and scope of the disclosure. For example, the hermetically sealed package may be used for a wide variety of devices including, without limitation, infrared MEMS such as bolometers, sometimes referred to as microbolometers, and certain inertial MEMS such as gyros and accelerometers, bonding discrete devices to a package, wafer bonding MEMS in a non-evacuated application (like a DLP) or vacuum packaging. Further, other materials may be used for the stress relief buffer layers 109DW and/or 109CW, such as, for example copper or aluminum. Further, other materials may be used for the substrate adhesion layer 122, such as, for example TiN. For this case both Ti and Ni act as a diffusion barrier for different stages of the fabrication process. Further, other materials may be used for the diffusion barrier such as Pt. Further, other materials may be used for the bonding material, such as for example, CuSn. Still further other overglass materials may be used, such as, for example SiN. Accordingly, other embodiments are within the scope of the following claims.

What is claimed is:

1. A method for preventing cracking in a substrate having a metal seal ring on a surface of the substrate and solder on the a top surface of the metal seal ring, the solder and the metal seal ring having coincident outer edges, the method comprising:

providing a metal stress relief layer between a bottom surface of the metal seal ring and the surface of the substrate with an outer edge of the metal stress relief layer extends outward from the coincident outer edges of the solder and the metal seal ring a distance sufficient to prevent the cracking; the metal stress relief layer comprising: an oxidation blocking/bonding material adhesion layer disposed on a top surface of the metal seal ring; and a diffusion barrier layer disposed under the oxidation blocking/bonding material adhesion layer;

providing a bonding material on the oxidation blocking/bonding material adhesion layer of the metal seal ring;

providing a metal stress relief buffer layer between the metal seal ring and the surface of the substrate; wherein the bonding material has a yield strength in the same order of magnitude as the yield strength of the stress relief buffer layer;

bonding the metal seal ring to the lid structure with the bonding material to form the hermetically sealed package; wherein the bonding material and the metal seal ring, absent the metal stress relief layer, cause cracking of the surface of the substrate; and wherein the metal stress relief buffer layer extends laterally beyond the bonding material a length sufficient to prevent the cracking of the substrate when bonding the metal seal ring to the lid structure with the bonding material forming a hermetically sealed package.

2. The method recited in claim 1 bonding material has a yield strength the same order of magnitude as the yield strength of the metal stress relief layer.

3. The method recited in claim 2 wherein the metal stress relief layer is titanium, copper or aluminum.

4. The method recited in claim 1 wherein the stress relief layer isolates a stress region at an edge of the bonding material from an underling region of the substrate.

* * * * *